United States Patent [19]
Hanke et al.

[11] 4,361,529
[45] Nov. 30, 1982

[54] METHOD FOR PRODUCING PLATE OR TAPE SHAPED SILICON CRYSTAL BODIES HAVING CRYSTALLINE PILLAR-LIKE STRUCTURES, EQUIVALENT TO COLUMNAR STRUCTURES, FOR LARGE SURFACE SOLAR CELLS

[75] Inventors: Leopold Hanke, Beyharting; Helmut Schmelz, Prien, both of Fed. Rep. of Germany

[73] Assignee: Siemens Aktiengesellschaft, Berlin & Munich, Fed. Rep. of Germany

[21] Appl. No.: 254,406

[22] Filed: Apr. 15, 1981

[30] Foreign Application Priority Data

May 9, 1980 [DE] Fed. Rep. of Germany ....... 3017831

[51] Int. Cl.$^3$ .............................................. C04B 35/14
[52] U.S. Cl. ...................................... 264/65; 264/86; 501/154
[58] Field of Search ..................... 501/154; 264/65, 86

[56] References Cited

U.S. PATENT DOCUMENTS 4,017,319  4/1977  Greskovich ........................... 264/65
4,040,848  8/1977  Greskovich ........................... 264/65
4,040,849  8/1977  Greskovich ........................... 264/65

Primary Examiner—John A. Parrish
Attorney, Agent, or Firm—Hill, Van Santen, Steadman, Chiara & Simpson

[57] ABSTRACT

The invention provides an improved method for producing plate-shaped or tape-shaped silicon crystal bodies having pillar-like structures therein which are equivalent to columnar structures comprising conducting the sintering process, for purposes of particle enlargement, in a gas atmosphere comprised of argon and a minimum amount of hydrogen. In a preferred embodiment, the hydrogen concentration in such atmosphere is about 6% by volume. The so-produced silicon bodies are useful for further processing into large-surface solar cells.

2 Claims, No Drawings

METHOD FOR PRODUCING PLATE OR TAPE SHAPED SILICON CRYSTAL BODIES HAVING CRYSTALLINE PILLAR-LIKE STRUCTURES, EQUIVALENT TO COLUMNAR STRUCTURES, FOR LARGE SURFACE SOLAR CELLS

CROSS-REFERENCE TO RELATED APPLICATION

Attention is directed to C. Grabmaier et al application for patent, U.S. Ser. No. 160,214, filed June 17, 1980, now U.S. Pat. No. 4,330,358, which is incorporated herein by reference.

BACKGROUND OF THE INVENTION

1. Field of the Invention

The invention relates to a process of producing silicon bodies for solar cells and somewhat more particularly to an improved process for producing plate-or-tape-shaped silicon crystal bodies having crystalline pillar-like structures therein, which are equivalent to crystalline columnar structures, without melting of the base materials which form such bodies and which are useful for further processing into large-surface solar cells.

2. Prior Art

The above-referenced Grabmaier et al application (assigned to the instant assignee) discloses and claims a method of producing plate- or tape-shaped silicon crystal bodies having pillar-like structures therein, which are equivalent to crystal columnar structures, without melting of the base material forming such bodies, which are particularly suitable for further processing into large-surfaced solar cells.

Somewhat more particularly, this earlier described method comprises forming a slurry from an admixture of silicon powder comprised of silicon particles having an average grain size of less than about 1 μm and a compatible liquid binder, extruding a relatively thin layer of such slurry with a suitable means, such as a tool for doctor-blading, on a base, drying such layer until it becomes essentially self-supporting and removing the base, and thereafter sintering such self-supporting slurry layer on a temperature-stable inert base in a protective gas atmosphere at a sintering temperature below about 1430° C. in such a manner that a layer of monocrystalline silicon particles is generated which particles have an average particle diameter corresponding at least to the thickness of the dried slurry layer.

With the method described in the above-referenced Grabmaier et al application, the silicon slurry layer is sintered on a quartz glass base in an argon stream or atmosphere at a temperature of about 1350° C. whereby silicon particles of less than 1 μm diameter become consolidated and become so great that granules or particles having a diameter greater than that of the initial layer thickness (approximately 150 μm) result.

However, crystal growth and particle consolidation is greatly obstructed by an oxide film (melting point greater than 1700° C.) which envelops each silicon crystal or particle (melting point equal to about 1405° C.) accordingly, additional oxygen supply at high temperatures, in particular, must be avoided.

High temperature treatment of silicon, such as melting or sintering, most often occurs in special furnaces which are coated with oxide materials, such as aluminum oxide and/or aluminum silicate. In instances where an argon atmosphere is utilized as a protective gas atmosphere during sintering or melting in such a furnace, an oxygen partial pressure at the elevated furnace temperatures, cannot be decreased below about $10^{-4}$ to $10^{-3}$ bar. This amount of oxygen is sufficient to generate an oxide film on the silicon crystals being treated and greatly obstructs crystal growth and, hence, the sintering process.

SUMMARY OF THE INVENTION

The invention provide an improved method of producing plate- or tape-shaped silicon bodies as set forth above wherein formation of oxide films on silicon crystal surfaces are suppressed.

In accordance with the principles of the invention, the earlier described Grabmaier et al method of producing plate- or tape-shaped silicon bodies is improved by conducting the sintering step in a gas atmosphere comprised of argon and an amount of hydrogen up to a maximum of about 20% by volume. In an exemplary embodiment of the invention, the amount of hydrogen in such sintering gas atmosphere is about 6% by volume.

DESCRIPTION OF PREFERRED EMBODIMENTS

The invention provides an improved method of manufacturing plate-shaped or tape-shaped silicon crystal bodies having a pillar-like structure, equivalent to a columnar structure, without melting of the base materials forming the silicon bodies whereby formation of oxide films on silicon crystal surfaces are suppressed.

Somewhat more particularly, the invention provides an improvement over a method of producing plate- or tape-shaped silicon crystal bodies having crystalline pillar structures therein wherein a slurry is formed from an admixture of silicon powder comprised of silicon particles having an average grain size in the range of less than about 1 μm and a compatible liquid binder, such as an aqueous solution of polyvinyl alcohol, a relatively thin layer of such slurry is extruded with the aid of a suitable means, such as a tool for doctor-blading, on a base, and dried until it becomes essentially self-supporting and, after removing the base, sintering such self-supporting slurry layer on a temperature-stable inert base in a protective gas atmosphere at a sintering temperature below about 1430° C. in such a manner that a layer of monocrystalline silicon particles is generated so that such particles have an average particle diameter corresponding to thickness of the dried slurry layer, by providing a protective gas atmosphere comprised of argon and an amount of hydrogen up to a maximum of about 20% by volume.

In an exemplary embodiment of the invention, the sintering gas atmosphere is comprised of an admixture of argon and hydrogen, with about 6% by volume of hydrogen.

By admixing relatively minimal amounts of hydrogen to an argon atmosphere, oxygen partial pressure is considerably reduced (to below $10^{-20}$ bar) and oxide formation on silicon crystal surfaces is completely prevented. As will be appreciated, such oxygen partial pressure results from the lining material of the furnace means used for sintering silicon crystals. Further, through the formation of silanes (generally in accordance with the reaction: $Si + 2H_2 \rightarrow SiH_4$), material transport via the gas phase is rendered possible, and, accordingly, sintering is favored.

Further, the handling of a gas mixture in accordance with the principles of the invention is still completely safe because given these concentrations of hydrogen in the protective gas, no explosion or the like can occur.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a method of producing plate- or tape-shaped silicon crystal bodies having crystalline pillar structures therein, which are substantially equivalent to crystalline columnar structures, without melting of the base material which forms such silicon bodies and which bodies are useful for processing into large-surface solar cells, wherein:

a slurry is formed from an admixture of silicon powder comprised of silicon particles having an average grain size in the range of less than about 1 $\mu$m and a compatible liquid binder;

a relatively thin layer of such slurry is extruded onto a base and dried until it becomes essentially self-supporting with removal of the base; and such self-supporting slurry layer is sintered on a temperature-stable inert base in a protective gas atmosphere at a sintering temperature below about 1430° C. in such a manner that a layer of monocrystalline silicon particles is generated, which particles have an average diameter substantially corresponding to the thickness of the dried slurry layer, the improvement comprising wherein:

said sintering occurs in a gas atmosphere comprised of an admixture of argon and hydrogen containing an amount of hydrogen up to a maximum of about 20% by volume.

2. In a method as defined in claim 1 wherein said sintering gas atmosphere contains about 6% by volume therein.

* * * * *